United States Patent
Shibahara et al.

[11] Patent Number: 5,185,067
[45] Date of Patent: Feb. 9, 1993

[54] PROCESS FOR MANUFACTURING DIAMOND-LIKE THIN FILM

[75] Inventors: Masanori Shibahara; Masatoshi Nakayama; Kunihiro Ueda, all of Saku, Japan

[73] Assignee: TDK Corporation, Tokyo, Japan

[21] Appl. No.: 547,736

[22] Filed: Jun. 29, 1990

[30] Foreign Application Priority Data

| Jul. 10, 1989 | [JP] | Japan | 1-175646 |
| Jul. 12, 1989 | [JP] | Japan | 1-178089 |
| Jul. 13, 1989 | [JP] | Japan | 1-179008 |
| Jul. 14, 1989 | [JP] | Japan | 1-180391 |
| Aug. 23, 1989 | [JP] | Japan | 1-214914 |

[51] Int. Cl.$^5$ .......................... C23C 16/50
[52] U.S. Cl. .............................. 427/523; 204/192.38; 427/577
[58] Field of Search ............. 204/192.16, 192.11, 204/192.31, 192.38, 298.05, 298.06, 298.11, 298.23; 427/38, 47, 122

[56] References Cited

U.S. PATENT DOCUMENTS

| 4,315,960 | 2/1982 | Ohji et al. | 204/298.11 X |
| 4,428,809 | 1/1984 | Heimbach et al. | 204/298.11 X |
| 4,486,286 | 12/1984 | Lewin et al. | 204/192.11 |
| 4,548,698 | 10/1985 | Sellschopp | 204/298.11 |
| 4,902,572 | 2/1990 | Horne et al. | 204/192.31 X |
| 4,981,568 | 1/1991 | Taranko et al. | 204/298.05 X |

FOREIGN PATENT DOCUMENTS

| 59-174507 | 9/1984 | Japan . |
| 1-234396 | 9/1989 | Japan . |
| 1-234397 | 9/1989 | Japan . |

OTHER PUBLICATIONS

"Diamondlike Carbon Films Prepared by Charged Particles", Y. Namba, Hyomen Kagaku, vol. 5, No. 108, pp. 108–115 (1984).

*Primary Examiner*—Nam X. Nguyen
*Attorney, Agent, or Firm*—Seidel, Gonda, Lavorgna & Monaco

[57] ABSTRACT

A diamond-like thin film formed on a substrate, with the peripheral region tapered toward the edge, satisfying the dimensional relation $$100 < b/a < 10{,}000$$

where a is the thickness of the film portion where the slope starts and b is the length of the slope. An apparatus for producing the film comprises a source for feeding a low-molecular-weight hydrocarbon or a feed gas capable of affording a low-molecular-weight hydrocarbon upon decompositon or reaction, means for ionizing the gas, a substrate held opposite to the ionizing means, and a mask member located between the ionizing means and the substrate. The apparatus and process using the apparatus are characterized in that the distance between the mask member and the substrate is fixed so as to obtain a diamond-like thin film satisfying the above-mentioned dimensional relation.

2 Claims, 6 Drawing Sheets

Fig. 6
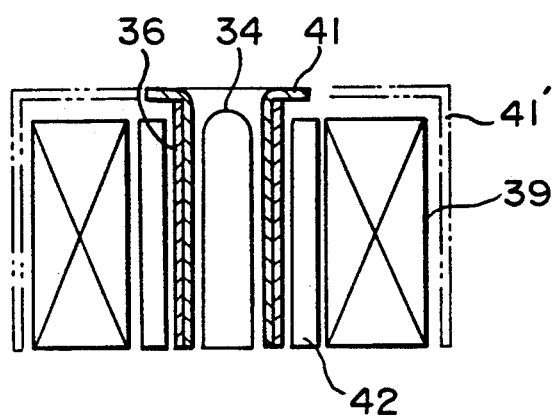
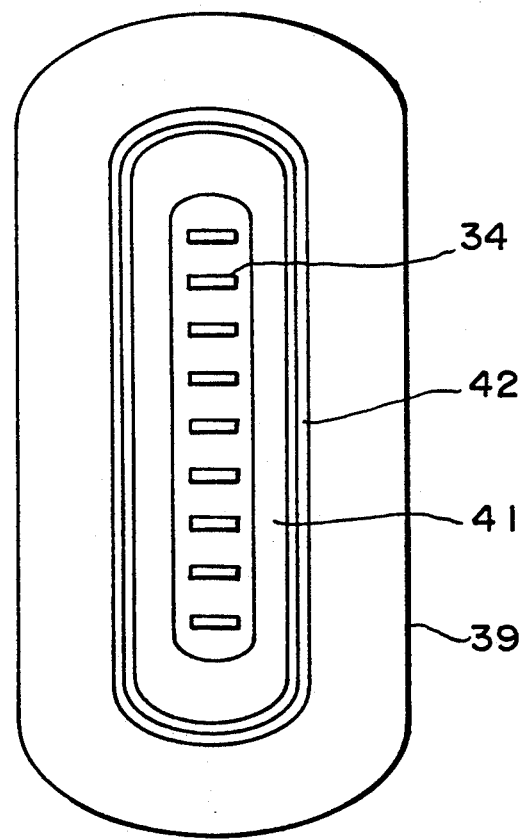
Fig. 7

Fig. 8
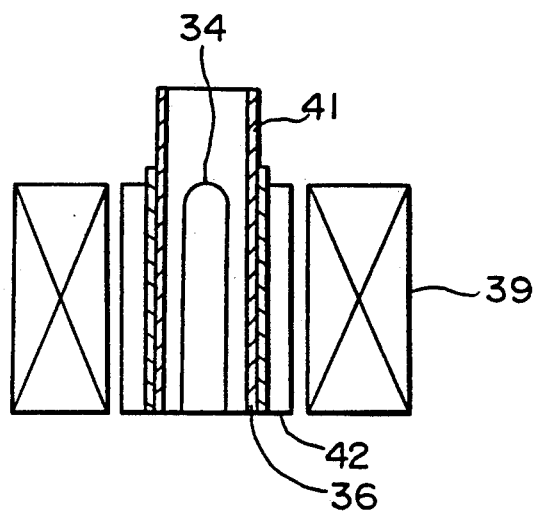
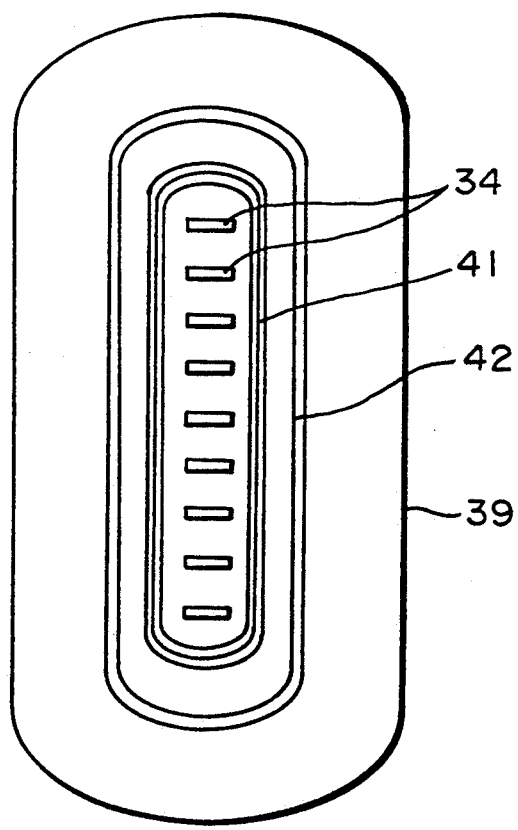
Fig. 9

PROCESS FOR MANUFACTURING DIAMOND-LIKE THIN FILM

BACKGROUND OF THE INVENTION

This invention relates to a diamond-like thin film and also to a process and an apparatus for manufacturing the same. More particularly, it concerns a technique of manufacturing an excellent diamond-like thin film free from crack and/or having good surface properties.

The expression "diamond-like" as used herein encompasses the thin films in the crystallinity range from a level high enough to be regarded as diamond to a slightly lower level.

Diamond-like thin films made by the vapor phase process have high hardness and excellent wear resistance, durability, and resistance to chemicals and corrosive attacks, and provide coatings on articles of varied shapes. They are useful or promising as protective films on articles for which one or more of the above-mentioned properties are essential requirements.

The equipment for the manufacture of diamond-like thin film by the vapor phase process is available in some types. (Refer, for example, to "HYOMEN KAGAKU" (Surface Chemistry), vol. 5, No. 108 (1984), pp. 108–115, "Various methods", and to the processes disclosed in Japanese Patent Application Nos. 59376/1988 and 59377/1988.) Diamond-like thin films are extensively used as corrosion- and wear-resistant protective coatings applied to objects of varying configurations that require surface protection.

However, the conventionally made diamond-like thin films tend to crack first along the periphery and then inwardly when the thickness or hardness exceeds certain limits, independently of the type of substrate used. Thus, adequate corrosion resistance or durability is not attained by a mere increase in thickness. On the other hand, if it is made thin enough to remain uncracked, the wear resistance and other desirable properties become deficient. The crack problem is presumably attributed to the fact that some ununiformity of conditions at the time of film forming, including the high-temperature heating of the substrate, applies internal stresses to the film and that the harder the film the more readily the internal stresses build up.

At the present time no process is available which produces a diamond-like thin film protected against cracking through relief of such internal stresses and free from cracking despite high hardness or adequate thickness.

The diamond-like thin films made by conventional processes are aggregates of minute crystals and therefore have sharp surface irregularities and roughness. Those thin films have such low binding forces with respect to the substrates that they come off easily from the latter. They also tend to crack owing to internal stresses. Thus, they cannot serve fully effectively in applications that require resistance to corrosion and wear. They are not quite reliable, either, when used on electronic and structural materials. A particularly notable tendency is that the surface properties of the films deteriorate as the hardness increases. In addition, the surface roughness makes the film less affinitive for adhesives and coating materials.

Among the prior art processes, ionization evaporation (Patent Application Public Disclosure No. 174507/1984 and Patent Application Nos. 59376/1988, 59377/1988, 1199/1989, 15093/1989, etc.) is known as a technique of producing diamonds or diamond-like films with long range order and relatively good continuity, flatness, and smoothness. Microscopically, the technique is still unable to give a completely continuous or flat and smooth film. The surface unevenness is rather worsened because the mesh of the grid renders the ion beam distribution ununiform.

The present invention is aimed at providing a diamond-like thin film free from crack and/or having adequate thickness, plus excellent surface properties. It is also aimed at providing a process and an apparatus for producing a diamond-like thin film of this character.

SUMMARY OF THE INVENTION

As a result of intensive research we found that internal stresses in a film, especially along its edges or periphery, have an important bearing upon the development of cracks. On the basis of the discovery, further studies have been made on film-forming conditions, peripheral structure of film, and the like. It has now been found, as one approach, that decreasing the thickness of the peripheral region gradually toward the edge gives favorable result. Thus, according to the present invention, it is now clear that the crack problem can be overcome when the peripheral region of a diamond-like thin film formed on a substrate is tapered toward the edge, satisfying the dimensional relation $$100 < b/a < 10,000$$

where a is the thickness of the film portion where the slope starts and b is the length of the slope.

The invention also provides an apparatus for producing a diamond-like thin film comprising a source for feeding a low-molecular-weight hydrocarbon or a feed gas capable of affording a low-molecular-weight hydrocarbon upon decomposition or reaction, means for ionizing the gas, a substrate held opposite to the ionizing means, and a mask member located between the ionizing means and the substrate, and a process for producing a diamond-like thin film using the apparatus, characterized in that the distance between the mask member and the substrate is fixed so as to obtain a diamond-like thin film satisfying the above-mentioned dimensional relation.

In another aspect, it has just been found that the film continuity and surface quality can be improved by controlling the energy of hydrocarbon gas ions and that consequent relief of internal stresses helps suppress the cracking along the periphery of the film.

Thus, according to the present invention, a diamond-like thin film with good surface properties and free from the crack problem can be made by carrying out the film-forming operation under the conditions $$5 < Va/A < 60 \text{ (V/mm)}$$

$$2 < B < 30 \text{ (mm)}$$

where A is the distance between the anode and the substrate, B the distance between the grid and the substrate, and Va the voltage applied across the anode and the substrate.

The process of the invention prevents the roughening of surface due to the network of the grid by positioning the grid far enough from the substrate to keep the hydrocarbon ion beam uniform. Moreover, because the hydrocarbon ion energy is optimized, the surface properties are improved and the internal stresses reduced.

In this aspect the mask is combined with means to locate it in spaced relation, at a given distance c, from the substrate surface, whereby the resulting film is tapered toward the periphery for further relief of the internal stresses.

This aspect allows the diamond-like thin film to have a less surface roughness, decreased possibility of cracking, and sufficiently high hardness.

We have further found that the surface quality of the film formed by ionization evaporation is impaired by the presence of a grid. Where there are obstacles, such as wires of the grid, in the straight path of hydrocarbon ions, the corresponding portions of the diamond-like thin film being formed on the substrate tend to become thinner while the unshadowed film portions grow thicker.

In still another aspect of the invention, therefore, the open area of the grid is controlled to improve the surface quality of the diamond-like thin film, establishing uniformity and continuity of the film. In this way the binding properties of the film are improved with respect to adhesives or the like as well as to the substrate. To be more exact, this aspect is characterized in that the grid has a hole density and an open area that satisfy, respectively, the conditions:

20 < No. of holes per 25.4 mm < 120
20% < open area < 80%.

In yet another aspect of the invention, the above objects are realized by a process for producing a diamond-like thin film characterized in that the grid and the substrate are caused to move repeatedly with respect to each other in the directions at right angles to the principal axis of the ion beam.

In accordance with the aspect, the effects of flattening and smoothening the resulting film are achieved. In this connection the above-mentioned Patent Application No. 15093/1989 and the like taught moving the substrate alone. It was intended to form a film as large in surface area as possible. The film is formed in a single, one-way run, and, if a desired thickness is to be attained, the substrate must be moved at a very low speed. Consequently, the flattening or smoothening effect is unsatisfactory.

BRIEF DESCRIPTION OF THE DRAWINGS

FIG. 6 is a vertically sectional view showing the filaments and anode and their surrounding parts;

FIG. 7 is a plan view of the arrangement of FIG. 6;

FIG. 8 is a sectional view similar to FIG. 6 but showing still another embodiment; and FIG. 9 is a plan view of the arrangement of FIG. 8.

DETAILED DESCRIPTION OF THE PREFERRED EMBODIMENTS

Figure 1:
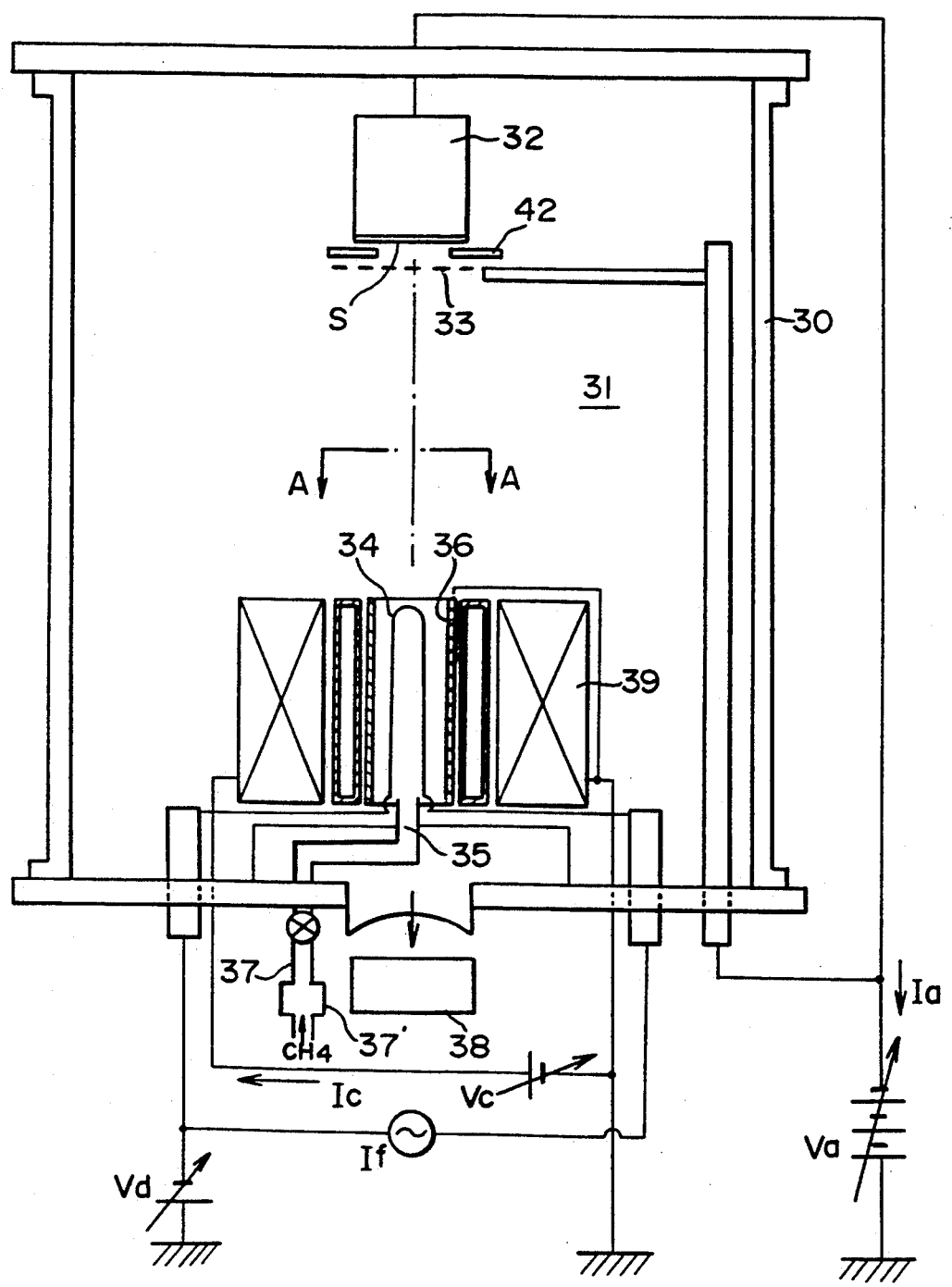
FIG. 1 is a schematic sectional view of an apparatus for forming a diamond-like thin film in accordance with the present invention.

As briefly outlined above, the diamond-like thin film according to the invention can be made by various film-forming techniques of the prior art. The process of the invention depends, in particular, upon ionization evaporation for the manufacture of a diamond-like thin film. This is because the resulting thin film has good quality and the process itself is easy to control.

Ionization evaporation uses a hydrocarbon feed gas or a feed gas capable of producing a hydrocarbon upon decomposition or reaction.

Here the term "hydrocarbon" is used to mean any of saturated hydrocarbons, such as methane, ethane, and propane, and unsaturated hydrocarbons, such as ethylene, propylene, and acetylene. The feed gas capable of producing a hydrocarbon on decomposition is an alcohol, such as methyl alcohol or ethyl alcohol, or a ketone, such as acetone or methyl ethyl ketone, or the like. The feed gas capable of producing a hydrocarbon gas on reaction is a mixed gas such as of carbon monoxide, carbon dioxide, and hydrogen or the like. The feed gas may contain at least one member of the family consisting of such rare gases as helium, neon, and argon, or hydrogen, oxygen, nitrogen, water, carbon monoxide, carbon dioxide, and the like.

According to the process, the feed gas is ionized by arc discharge across a cathode and an anode or by thermionic emission between cathode hot filaments and an anode, and the resulting ion beam is accelerated by an electric field and directed to the substrate, whereby a diamond-like film is formed on the substrate. As described in Patent Application Public Disclosure No. 174507/1984, Patent Application Nos. 9376/1988, 59377/1988, 11991/1989, 15093/1989, etc., ionization evaporation does not require such a high substrate temperature above 700° C. as are used in other processes. (Refer, e.g., to "HYOMEN KAGAKU" (Surface Chemistry), Vol. 5, No. 108 (1984), pp. 108-115, "Various processes".) The process is also superior in that it achieves a high film-forming efficiency and that the resulting diamond-like film has good surface quality and high hardness, heat transfer rate, and refractive index, while eliminating the necessity of surface finish.

When an ion beam is fixed and the substrate is moved, or conversely when the substrate is fixed and the ion beam in the form of a plasma of ionized hydrocarbon is allowed to scan deflectedly in the direction substantially perpendicular to the original direction, a diamond-like thin film can be formed over a broad substrate surface. Such a deflecting magnetic field can be created by the use of a permanent magnet or electromagnet which produces a magnetic field in a direction crossing the direction of acceleration of the ion beam. Whether the substrate is fixed or movable, it is important that the periphery of the resulting film be formed as taught by the present invention.

The ionization evaporation that forms a technical basis of the present invention is described in Patent Application Nos. 59377/1988, 59376/1988, 1199/1989, 15093/1989, etc. In the working examples of the present invention are used a process and an apparatus based on the apparatus described in these prior publications.

OUTLINE OF THE FILM-FORMING APPARATUS

FIG. 1 illustrates a preferred embodiment of a film-forming apparatus. The numeral 30 designates a vacuum vessel and 31 a chamber therein connected to an evacuation system 38 so as to be evacuated to a high vacuum up to about $10^{-6}$ Torr. The numeral 32 indicates an electrode located at the back of a substrate S, and in this case a voltage Va is applied to the electrode. Close to the surface of the substrate S, a mask 42 is located. The mask has a window to define the contour of a diamond-like thin film D to be formed. A grid 33, at the same potential Va with the electrode, is used for ion beam acceleration. Hot cathode filaments 34 are heated by an AC source If for thermionic emission and are kept at a negative potential. The numeral 35 indicates an inlet for feeding hydrocarbon gas as a starting material. An anode 36 is disposed around the filaments 34 to apply a voltage Vc between itself and the filaments. A solenoid 39 is located so as to surround the filaments 34, anode 36, and feed inlet 35 to produce a magnetic field for the containment of ionized gas. The solenoid is connected to a DC source for a current Ic and voltage Vc. It is thus possible to modify the quality of the resulting film through the adjustments of the voltages Vc, Vd, and Va and the current Ic in the solenoid.

Figure 3:
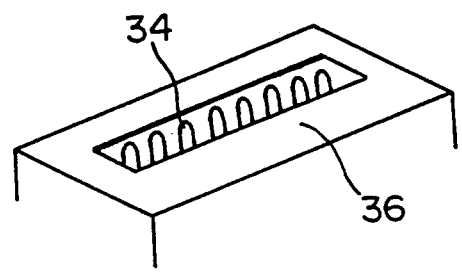
FIG. 3 is a top view, in perspective, showing the structure of a filament assembly.

FIG. 3 is a perspective representation of a plan as viewed from the arrows A—A in FIG. I. When a film of rectangular shape is to be formed, either an assembly of a plurality of filaments as shown or a coiled filament is used.

Turning to FIG. 1, a plasma exciter 37' is provided on a line 37 which feeds the hydrocarbon gas, so as to enhance the efficiency of the ionization apparatus. For the plasma excitation, it is possible to utilize, e.g., microwave, high frequency (RF) waves, radiant rays, or ultraviolet rays.

Figure 2:
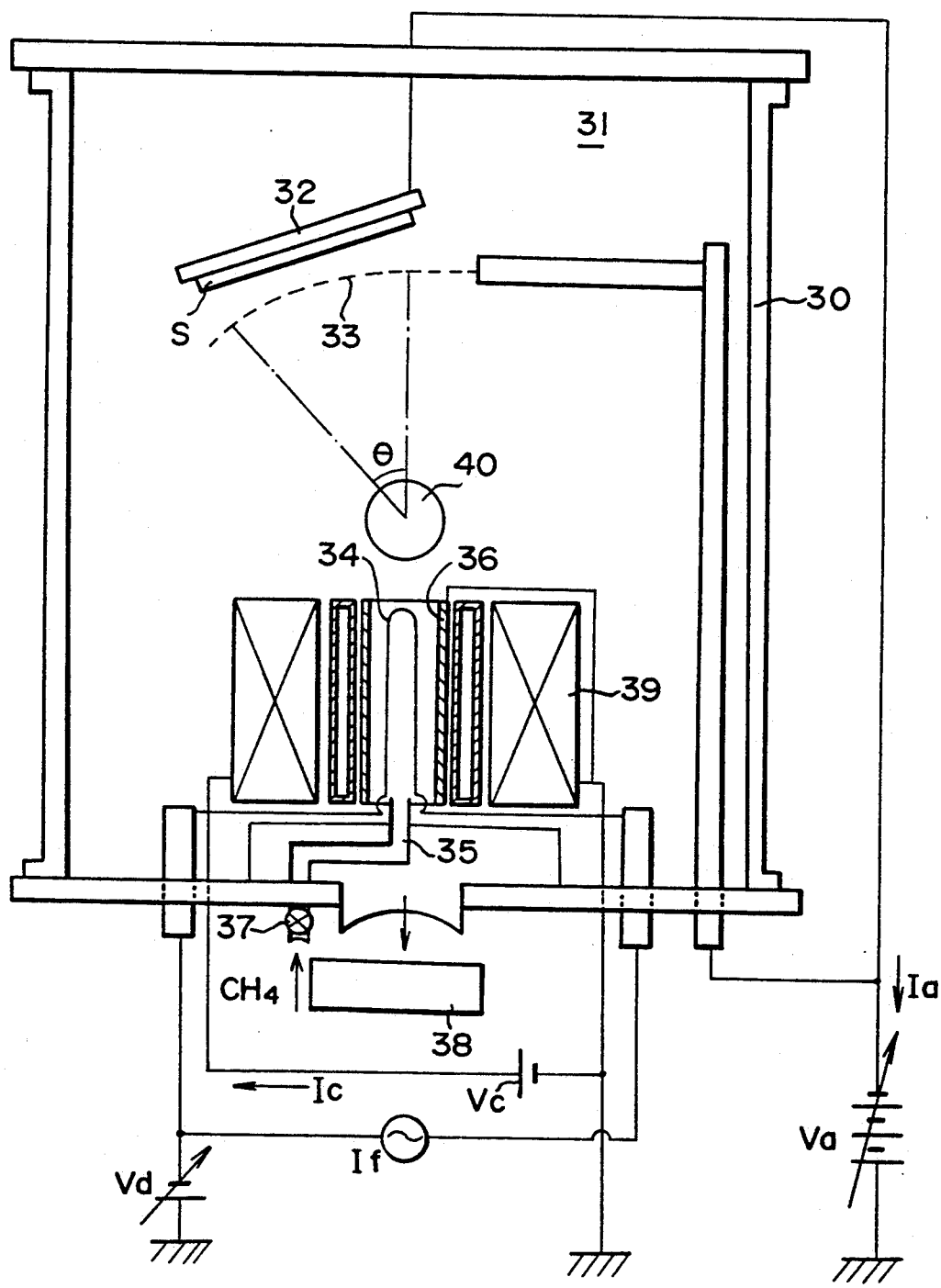
FIG. 2 is a schematic sectional view of another embodiment of the diamond-like-film-forming apparatus of the invention.

It is further possible, as shown in FIG. 2, to modify the construction of FIG. 1 partly by disposing a magnet 40 of fixed or variable intensity above the filaments 34 and use it for the deflection of the plasma-like ion beam. The magnetic field of the magnet 40, with fixed or variable intensity, is directed across the direction of the ion beam. In this way a deflection angle $\theta$ is obtained with respect to the desired ion, e.g., $CH_3^+$ or $CH_4^+$. With a magnet of fixed field intensity, ions vastly different in mass from these ions, such as hydrogen ions, are deflected to an even greater angle. Neutral particles and heavy polymeric ions, on the other hand, move straight ahead. Provision of a mask in the straight direction, therefore, permits only the ions of high crystallinity to deposit on the substrate S.

Figure 4:
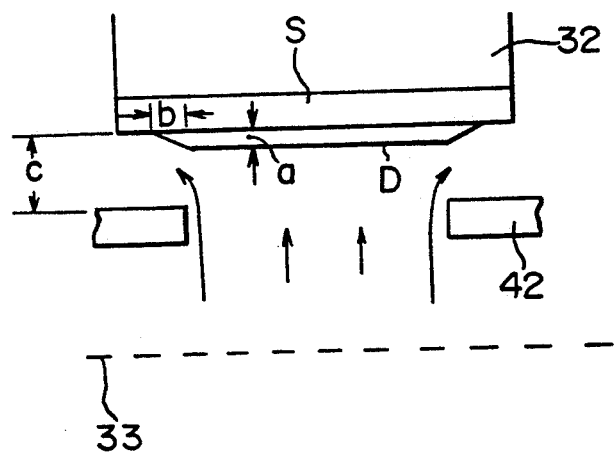
FIG. 4 is an enlarged view of a portion of the apparatus of FIG. 1 showing the mask, substrate, and associated parts.

FIG. 4 shows a portion of FIG. 1 on an enlarged scale to clarify the characteristics of the present invention. Between the grid 33 and the substrate S, the mask 42 is interposed at a prefixed distance C in the range from about 0.5 to about 10 mm from the mask. A distance within this range permits appropriate step coverage of ions and formation of a slope in each edge of the diamond-like thin film being deposited and grown on the substrate. The dimensional requirement of the slope is that it satisfy the relation $$100 < b/a < 10,000$$

where a is the thickness of the film region where the slope starts and b is the length of the slope. Typical values of the dimensions are for a from about 0.1 to about 10 μm, for from about 20 to about 20,000 μm, and for c from about 0.5 to about 10 mm. Choice of the b/a may be based on the distance c. The space between the grid 33 and the substrate ranges from about 2 to 30 mm. If the ratio b/a is too small, cracking cannot be avoided. If it is too large, the film-forming rate decreases and, in particular, the peripheral portion of the film becomes too thin, with concomitant reduction of film hardness.

In the second aspect of the invention, the mask is preferably spaced from the substrate as depicted in FIG. 4, although it is not objectionable that the two are kept in contact.

Figure 5:
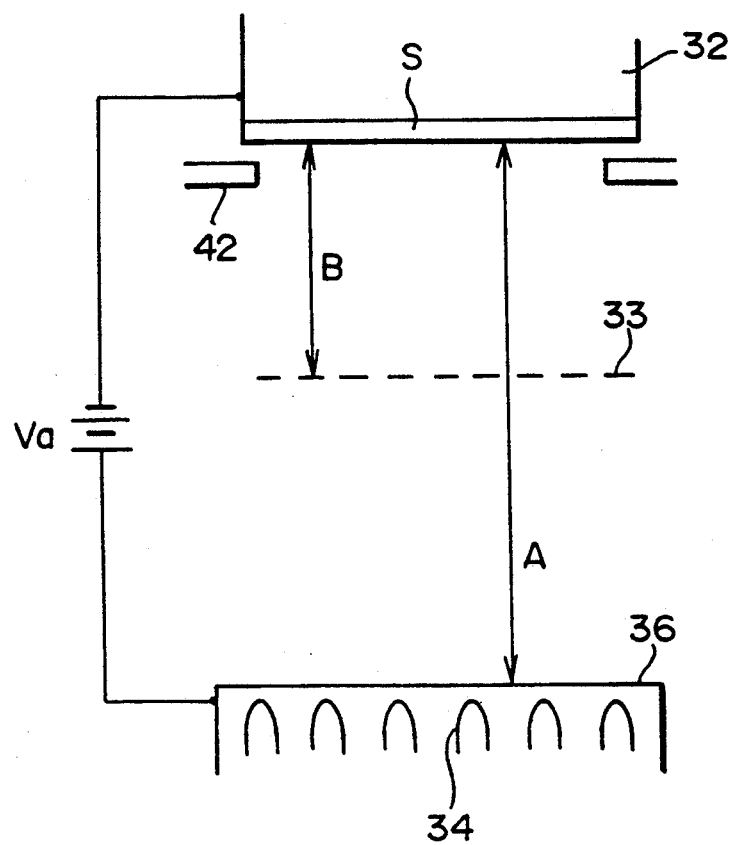
FIG. 5 is an enlarged view of a portion of the apparatus of FIG. 1 illustrating the relations among the anode, grid, and substrate.

FIG. 5 enlarges a portion of FIG. 1 to show better the second aspect of the present invention. According to this aspect, the mask may be in contact with the substrate but is preferably spaced, where possible, from it as in FIG. 4. The grid 33 is spaced a distance B from the substrate S, and the anode 36 is spaced a distance A from the substance and is at a positive potential Va with respect to the substrate. Here the distances A and B and the potential Va should satisfy the relations:

$$10 < Va/A < 60 \text{ (V/mm)}$$

$$2 < B < 30 \text{ (mm)}$$

The reasons for which the above relations must be satisfied are as follows:

(1) Va/VA: This value signifies the average field value. If it is less than 5 (V/mm), the surface quality of the film is improved because the energy of hydrocarbon ions is low and the ion beam diffracts well after passage through the grid. However, the film hardness declines due to the inability of giving sufficient energy to the hydrocarbon ions. If the value exceeds 60 (V/mm), both the crystallinity and hardness increase but the surface roughness worsens.

(2) B: Spacing the substrate and the grid a distance of 30 mm or more leads to abnormal discharge, although it permits the ion beam to pass through the grid and diffract well to produce a uniform film. The abnormal discharge causes increased surface defects, eventually impairing the surface properties of the resulting film. If the B value declines below 2 mm, the step coverage of hydrocarbon ions deteriorates and the surface roughness increases.

The values within the specified ranges of the invention, by contrast, ensure good step coverage of hydrocarbon ions and allow adequate ion energy to be secured. Consequently, sufficiently high hardness and uniform, continuous film quality are obtained. These, in turn, decreases the surface roughness and alleviates the crack problem. The upper and lower limits of the two requirements referred to above are correlated to some extent. When the distance B is increased, the step coverage is improved with the result that an electric field in the range from a small to a large values can be used. When the distance B is small, the step coverage is poor and the electric field must be confined to a smaller range.

The structure of the grid, which constitutes another aspect of the present invention, will now be explained. While the grid is available in varied types, typical of them are a texture of metal wire woven in a netlike pattern, such a netting rolled by passage through a pair of metal rolls, and a metal sheet etched to form round or square perforations throughout. Our experiments showed that the diamond-like thin films formed using these grids with properly chosen hole density (number of holes per inch) and open area (the total area of holes per unit area of the grid), have improved continuity and markedly reduced surface roughness. To be more specific, the number of holes per inch (25.4 mm) must be greater than 20 and fewer than 120, and the open area larger than 20% and less than 80%. When these two conditions are simultaneously satisfied, a notable decrease in suface roughness, improvement of surface properties, and enhanced adhesion to the substrate are achieved without sacrificing the film-forming rate.

Too low a hole density would increase the surface roughness of the film to excess. If the hole density is too high, the surface roughness does decrease but the film-forming rate declines and both the hardness and adhesion to the substrate are reduced. The open area should not be too large or too small, otherwise the surface will be roughened and the adhesion decreased.

Means for repeatedly moving the grid in its planar directions (for repeated turning or reciprocating movement) may consist, e.g., of a motor and an eccentric crank to be driven thereby (both not shown). Alternatively, the substrate S alone may be repeatedly moved in place of reciprocatingly moving the grid 33. When the substrate is, e.g., a disc, it is possible to turn it in a circular direction. Experiments have shown that a desirable relative speed ranges from 5 to 10 mm per minute.

In some instances the electrons emanating from the filaments can partly remain unused for the ionization of hydrocarbon gas, causing localized abnormal discharge instead. When such is the case, the plasma-forming efficiency drops strikingly, and the abnormal discharge can induce the liberation of metal particles from the anode surface or force carbon particles deposited on the surface to come off and settle on the substrate, producing defects in the resulting diamond-like thin film. In order to avoid these, it is preferable to dispose a shielding member of heat-resisting metal at a positive potential with respect to the hot cathode filaments or at substantially the same potential with the anode in the region where the flow of the plasma produced by the filaments is directed from the front end on the substrate side toward the solenoid means. The control of the abnormal discharge greatly extends the filament life. It then eliminates the need of destroying the vacuum for filament replacement and then re-evacuating the vessel. A further advantage is that the shielding member, which is heat-resistant, undergoes no localized change in surface conditions which can otherwise result from long-term electric discharge between the member and the filaments, thus removing the cause of abnormal discharge.

FIRST EMBODIMENT

An embodiment of the invention will be described in detail below with reference to FIGS. 6 and 7. The ionizing means and peripheral parts shown comprise filaments 34, an anode 36, a cooling jacket 42 surrounding them, and a solenoid 39 disposed further outside the jacket. The inner side of the anode 36 is lined with a heat-resisting metal shielding member 41. This lining is not always essential but the use of it is recommended because it serves as a heat-resisting anode. The shielding member 41 is bent above the anode 36 to extend horizontally in a flangelike fashion. The member is made of a heat-resisting metal such as Mo or W to stand the high temperature of plasma containing electrons, etc. It is important that the member be located in a position and over an area where its presence can increase the film-forming rate, or at least around the upper end of the anode 36. More preferably, the shielding member is disposed to surround the solenoid, as indicated by chain lines 41' in FIG. 6.

The flow of electrons released by the filaments, ionized hydrocarbon gas, or plasma containing the both spreads toward the solenoid 39, as shown partly. The spread has hitherto been responsible for abnormal discharge. This is evident from the fact that the abnormal discharge no longer takes place when the spread is restricted by the provision of the shielding member in accordance with the invention. It is surprising that the mere presence of the shielding member eliminates the abnormal discharge. Thus, the plasma density is increased and a larger volume of hydrocarbon ions is directed toward the substrate S (FIGS. 1 or 2).

Film-forming

The process of film forming will now be explained in detail with reference to FIG. 1. First, the chamber 31 is evacuated to a high vacuum of $10^{-6}$ Torr. By manipulating a valve on a gas feed line 37, methane gas or its mixture with hydrogen, with or without a carrier gas such as Ar, He, or Ne, is introduced at a predetermined flow rate via an inlet 35 into the chamber, while maintaining a desired gas pressure, e.g., $10^{-1}$ Torr, through control of an evacuation system 38. Hot cathode filaments 34 are heated with an alternating current If, and a potential difference Vd is applied across the filaments 34 and the anode 36 for an electric discharge. The methane gas from the feed inlet 35 is thermally decomposed and collides with the thermions from the filaments to generate positive ions and electrons, the electrons in turn colliding with other thermally decomposed particles. The phenomenon is repeated under the containment action of the magnetic field of the solenoid until the methane gas is completely converted to positive ions of the thermally decomposed substance.

The positive ions are attracted by the negative potential Va applied to the electrode 32 and the grid 33. They are accelerated toward the substrate S and impinge upon it to effect a film-forming reaction, whereby a diamond-like thin film is formed. If desired, a thin film of better quality may be obtained by the use of the afore-mentioned fixed magnet.

As an alternative, another ionizing means will be described in conjunction with FIGS. 8 and 9. As it differs merely in the structure of the shielding member, only the difference will be hereinafter described in detail. The heat-resisting metal shielding member 41 in this case is used as a lining of the anode 36 and is also extended above the filaments to a height enough to interrupt the spread of the plasma toward the solenoid. The shielding member is built of Mo, W, or other metal capable of resisting the high temperature of plasma to be encountered.

For the potentials, currents, temperatures and other conditions of the parts involved, please refer to the literature including the afore-cited patent applications and publications.

The thickness of the film to be formed preferably ranges from 100 to 10,000 Å. If the film is thinner than the range the wear-resisting and other beneficial effects are reduced. If it is thicker, no more effects are attained while the production time is prolonged.

Ultrasonic cleaning of the substrate with an organic solvent before the formation of a diamond-like thin film gives better result.

The invention is illustrated by the following examples.

EXAMPLE 1

The apparatus shown in FIG. 1 was used, and a plate substrate S placed in the vacuum chamber 30. At the distance c 500 μm or 1000 μm from the substrate surface, a mask 42 having an opening 10 mm wide and 10 mm long was disposed, and a grid 33 was located at a distance B=6 mm from the substrate S. The distance A between the substrate S and the anode was about 40 mm.

Following the evacuation of the vacuum chamber 30 to $10^{-6}$ Torr, methane gas was introduced and, at a gas pressure of $10^{-1}$ Torr, hot cathode filaments 34 were allowed to cause an electric discharge. The magnetic flux density of the solenoid 39 was 400 gausses, the substrate voltage Va −300 V, and the substrate temperature 200° C. An alternating current If of 25 A was flown through the filaments 34.

The filaments 34 were in the form of elongated coils 3 mm wide and surrounded by an anode 36 with a spacing of 8 mm from the electrode.

Under the conditions of Vc=30 V and Vd=−30 V, one-micron-thick diamond-like films were obtained.

Each film was measured for its thickness a and the length of the slope b, and inspected for cracks along the edges. The results are summarized in Table 1.

TABLE 1

| | c, μm | a, μm | b, μm | Cracking | Ra, μm |
|---|---|---|---|---|---|
| Example of the invention | 500 | 1 | 1000 | No | 800 |
| | 1000 | 1 | 2000 | No | 500 |
| Comparative example | 0 | 1 | 80 | Yes | 3000 |

As can be seen from Table 1, the diamond-like thin films formed on the substrates in conformity with the invention are protected against cracking when the dimensions of the sloped portion on the periphery satisfy the condition $$100 < b/a < 10,000$$

and, to have the condition satisfied, it is advisable to locate the mask at a point c from 0.5 to 10 mm distant from the substrate.

EXAMPLE 2

Using the apparatus of FIG. 1, a plate substrate S was placed in the vacuum chamber 30. At each of varying distances B from the substrate surface, a grid 33 was located. The distance A between the substrate S and the anode was about 40 mm.

The vacuum chamber 30 was evacuated to $10^{-6}$ Torr, and then methane gas was introduced. At a gas pressure of $10^{-6}$ Torr, hot cathode filaments 34 were allowed to cause an electric discharge. The magnetic flux density of the solenoid 39 was 400 gausses, the substrate voltage Va from −200 to −2000 V, and the substrate temperature 200° C. An alternating current If of 25 A was flown through the filaments 34.

The filaments 34 were in the form of coils 3 mm wide and surrounded by an anode 36 with a spacing of 8 mm in between.

Under the conditions of Vc=30 V and Vd=−30 V, one-micron-thick diamond-like films were obtained.

The surface roughness Ra of each film was measured (in conformity with JIS B0601). The number of surface defects was counted under microscopic observation. The Vickers hardness Hv was determined, and cracking along the edges inspected. The results are given in Table 2.

The number of surface defects was counted under observation with an optical microscope (400×), and the evaluation was based on the number of defects 2 μm or larger in diameter present in each square centimeter of the specimen.

TABLE 2

| | Va/A, V/mm | B, mm | Ra, μm | No. of defect | Cracking | Hardness, Hv |
|---|---|---|---|---|---|---|
| Example | 20 | 6 | 800 | 0 | No | 7000 |
| | 20 | 20 | 500 | 0 | No | 6000 |
| | 25 | 15 | 900 | 0 | No | 6500 |
| | 55 | 20 | 950 | 0 | No | 7000 |
| Comp. Ex. | 3 | 6 | 500 | 1 | No | 2000 |
| | 65 | 6 | 3000 | 5 | Yes | 5000 |
| | 20 | 1 | 3000 | 10 | Yes | 6500 |
| | 20 | 40 | 1500 | 8 | Yes | 2000 |

As will be clear from Table 2, diamond-like thin films with good surface quality, high hardness, and few cracks could be formed on the substrates through control of the electric field and the grid position at the time of film forming in accordance with the invention.

EXAMPLE 3

The apparatus of FIG. I was used and a plate substrate S was placed in the vacuum chamber 30. At a distances of about 6.0 mm from the substrate surface, a grid 33 was located. The distance between the substrate S and the anode was about 40 mm. The hole density of grids 33 used ranged between 15 and 140 holes/25.4 mm and the open area ranged from 31 to 62%.

The vacuum chamber 30 was evacuated to $10^{-6}$ Torr, methane gas was introduced, and, at a gas pressure of $10^{-1}$ Torr, hot cathode filaments 34 were allowed to cause an electric discharge. The magnetic flux density of the solenoid 39 was 400 gausses, the substrate voltage Va −300 V, and the substrate temperature 200° C. An alternating current If of 25 A was flown through the filaments 34.

The filaments 34 were in the form of coils 3 mm wide and surrounded by an electrode 36 with a spacing of 8 mm from the latter.

Under the conditions of Vc=30 V and Vd=30 V, one-micron-thick diamond-like films were obtained.

With each film thus obtained, measurements were made of the surface roughness Ra (in conformity with JIS B0601), filmforming rate, the number of surface defects as observed under a microscope, adhesion, and Vickers hardness Hv. The results are summarized in Table 3. The number of surface defects was counted under observation with an optical microscope (400×), and the evaluation was based on the number of defects 2 μm or larger in diameter present in each square centimeter of the sample. The adhesion of the diamond-like thin film was determined by joining it to a square bar 1 cm by 1 cm by 10 cm long with epoxy resin. The film on the bar was pulled off under tension by a tensile tester (marketed under the trade designation "Tensilon"). The separation along the interface between the square bar and the adhesive was marked "O" and that along the interface between the film and the substrate "X".

TABLE 3

|  | No. of holes/ 25.4 mm | Open area, % | Ra, μm | No. of def. | Film-formg rate, μ/h | Ad-he-sion | Hard-ness, Hv |
| --- | --- | --- | --- | --- | --- | --- | --- |
| Ex-ample | 40 | 46 | 950 | 0 | 3.5 | O | 6500 |
|  | 60 | 41 | 800 | 0 | 4.0 | O | 7000 |
|  | 80 | 48 | 500 | 0 | 3.5 | O | 7000 |
| Comp. Ex. | 10 | 62 | 3000 | 5 | 1.0 | X | 5000 |
|  | 140 | 31 | 400 | 3 | 0.5 | X | 2000 |
|  | 60 | 15 | 5000 | 20 | 0.1 | X | 2500 |

Table 3 clearly indicates that the adjustments of the grid structure in accordance with the invention made it possible to form diamond-like thin films with good surface quality, hardness, and adhesion, and few cracks on the respective substrates.

EXAMPLE 4

The apparatus of FIG. 1 was used, and a plate substrate S was placed in the vacuum chamber 30. At a distance of about 6.0 mm from the substrate surface, a grid 33 was located. The distance between the substrate S and an anode was about 40 mm. The grid 33 had a hole density of 60/25.4 mm and an open area of 41%.

The vacuum chamber 30 was evacuated to $10^{-6}$ Torr, methane gas was introduced, and, at a gas pressure of $10^{-1}$ Torr, hot cathode filaments 34 were caused to effect an electric discharge. The magnetic flux density of the solenoid 39 was 400 gausses, the substrate voltage Va −300 V, and the substrate temperature 200° C. An alternating current If of 25 A was flown through the filaments 34.

The filaments 34 were in the form of coils 3 mm wide and surrounded by an electrode 36 with a spacing of 8 mm from the latter. The grid 33 was reciprocatingly moved at the rate of 5 to 10 mm per minute.

Under the conditions of Vc=30 V and Vd=−30 V, one-micron-thick diamond-like films were obtained.

The films thus obtained were tested for their surface roughness Ra (in conformity with JIS B0601) and Vickers hardness Hv. The results are summarized in Table 4.

TABLE 4

|  | mm/ min | No. of holes/ 25.4 mm | Open area, % | Ra, μm | Hard-ness, Hv | Remarks |
| --- | --- | --- | --- | --- | --- | --- |
| Ex-ample | 10 | 60 | 41 | 300 | 6500 | Substrate moved |
|  | 15 | 60 | 41 | 250 | 6800 | Grid moved |
| Comp. Ex. | 0 | 60 | 41 | 1000 | 6800 | No move |
|  | 0.02 | 60 | 41 | 850 | 6500 | Substrate moved |
|  | 0.05 | 60 | 41 | 900 | 6800 | Grid moved |

It will be appreciated from Table 4 that the relative movement of the substrate and the grid in accordance with the invention permits a diamond-like thin film with good surface properties and high hardness to be formed on a substrate.

EXAMPLE 5

The features shown in FIG. 6 were incorporated in the apparatus of FIG. 1. A plate substrate S was placed in the vacuum chamber 30, and a grid 33 was located at a distance of about 6.0 mm from the surface of the substrate which was made of soft steel (STC). The distance between the substrate S and the anode was about 40 mm. The horizontal cross section of a space formed by the inner wall of the anode was rectangular, measuring 200 mm by 20 mm. A 0.5 mm-thick Mo sheet was attached to the periphery of the anode.

The vacuum chamber 30 was evacuated to $10^{-6}$ Torr, methane gas was introduced, and, at a gas pressure of $10^{-1}$ Torr, hot cathode filaments 34 were caused to discharge. The magnetic flux density of the solenoid 39 was 400 gausses and the substrate temperature 200° C. An alternating current If of 25 A was flown through the filaments 34 in the form of coils 3 mm wide and surrounded by a rectangular electrode 36 with a spacing of 8 mm from the latter. Under the conditions of If=225 A and Va=−300 V, one-micron-thick diamond-like films were obtained. The voltage Vd was adjusted to be Id=5 A.

For the purposes of comparison, films were formed under the same conditions as used above with the exception that the shielding member was eliminated.

The results are shown in Table 5. In the table the column "Defects" summarizes the evaluations based on the number of defects counted under a 400× optical microscope. The filament life is the mean of the time periods the individual filaments functioned until they broke after several film-forming runs.

EXAMPLE 6

Experiments were made with the embodiment illustrated in FIGS. 8 and 9. In Example 5 the height of the shielding member 41 from the upper end of the anode was fixed to 20 mm. Table 5 gives the results.

TABLE 5

|  | Vd, V | Id, A | Hv | De-fect | Mean fil. life, Hr | Abn. disc. | Anode shape |
| --- | --- | --- | --- | --- | --- | --- | --- |
| No Mo | 30 | 5 | 7000 | Many | 5 | Yes | FIG. 1 |
| Ex. 5 | 7 | 5 | 7100 | Some | 20 | No | FIG. 6 |
| Ex. 6 | 5 | 5 | 7200 | Some | 22 | No | FIG. 5 |

As Table 5 indicates, abnormal discharge could be prevented and the efficiency of forming a diamond-like thin film improved by covering at least a part of the plasma-generating side of the solenoid surface with a heat-resisting metal shielding electrode. By the same token, the number of defects in the film could be reduced and the filament life extended.

What is claimed is:

1. A process for producing a diamond-like thin film, said process comprises:
    (a) feeding into a vacuum chamber a lower hydrocarbon or a feed gas capable of affording a lower hydrocarbon upon deposition or reaction, said lower hydrocarbon being selected from the group consisting of methane, ethane, propane, ethylene, propylene, acetylene, methyl alcohol, ethyl alcohol, acetone, and a mixed gas of carbon monoxide and hydrogen,
    (b) ionizing the feed gas by an ionizing means composed of hot cathode filaments and an anode disposed around the filaments to form a hydrocarbon ion beam, and (c) accelerating the ion beam with a grid at a lower potential than the anode against the substrate surface for a film-forming reaction thereon, said grid being repeatedly moved relative to the substrate in a direction which is at a right angle to the principal axis of the ion beam.

2. A process according to claim 1 wherein said grid has a hole density and an open area that satisfy, respectively, the conditions:

20 < number of holes per 25.4 mm < 120 in each direction of two axes normal to each other, and 20% < open area < 80%.

* * * * *